US010886409B2

(12) United States Patent
Song et al.

(10) Patent No.: US 10,886,409 B2
(45) Date of Patent: Jan. 5, 2021

(54) DISPLAY BACKPLATE AND FABRICATION METHOD THEREOF, DISPLAY PANEL AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 25 days.

(21) Appl. No.: 16/170,470

(22) Filed: Oct. 25, 2018

(65) Prior Publication Data

US 2019/0214504 A1 Jul. 11, 2019

(30) Foreign Application Priority Data

Jan. 10, 2018 (CN) .......................... 2018 1 0021897

(51) Int. Cl.
*H01L 27/12* (2006.01)
*H01L 29/786* (2006.01)

(52) U.S. Cl.
CPC ...... *H01L 29/78633* (2013.01); *H01L 27/124* (2013.01); *H01L 27/1218* (2013.01); *H01L 27/1255* (2013.01); *H01L 27/1262* (2013.01); *H01L 29/78648* (2013.01)

(58) Field of Classification Search
CPC .......................... H01L 27/1218; H01L 27/124
See application file for complete search history.

(56) References Cited

U.S. PATENT DOCUMENTS 6,569,717 B1 5/2003 Murade
6,610,997 B2 8/2003 Murade
8,319,715 B2 11/2012 Zhang
(Continued)

FOREIGN PATENT DOCUMENTS

CN 1716635 A 1/2006
CN 101022094 A 8/2007
(Continued)

OTHER PUBLICATIONS

Chinese Office Action in Chinese Application No. 201810021897.4, dated Mar. 27, 2020 with English translation.
(Continued)

*Primary Examiner* — Douglas M Menz
(74) *Attorney, Agent, or Firm* — Collard & Roe, P.C.

(57) ABSTRACT

A display backplate and a fabrication method thereof, a display panel and a display device are provided. The display backplate includes: a substrate; a first light shielding layer, provided on the substrate; a first thin film transistor, provided on a side of the first light shielding layer facing away from the substrate, and including a first active layer, a first source electrode, a first drain electrode and a first top-gate electrode; a first layer, including a first semiconductor portion and a first conductor portion, the first semiconductor portion constituting the first active layer; and a third electrode, the first conductor portion being provided between the first light shielding layer and the third electrode. The first light shielding layer and the first conductor portion form a first capacitance, and the third electrode and the first conductor portion form a second capacitance.

16 Claims, 8 Drawing Sheets

(56) References Cited

U.S. PATENT DOCUMENTS

| | | | | |
|---|---|---|---|---|
| 9,647,009 | B1 | 5/2017 | Zhao et al. | |
| 9,947,771 | B2 | 4/2018 | Park | |
| 2002/0163016 | A1 | 11/2002 | Shibata | |
| 2011/0147757 | A1 | 6/2011 | Kim et al. | |
| 2014/0175445 | A1 | 6/2014 | Cai et al. | |
| 2017/0294497 | A1* | 10/2017 | Lius | H01L 27/1225 |
| 2018/0197897 | A1 | 7/2018 | Xin et al. | |

FOREIGN PATENT DOCUMENTS

| | | | |
|---|---|---|---|
| CN | 101022095 | A | 8/2007 |
| CN | 103268047 | A | 8/2013 |
| CN | 103293790 | A | 9/2013 |
| CN | 103904086 | A | 7/2014 |
| CN | 104900655 | A | 9/2015 |
| CN | 105679765 | A | 6/2016 |
| CN | 107331669 | A | 11/2017 |

OTHER PUBLICATIONS

Taiwanese Office Action in Taiwanses Application No. 107134771, dated Jun. 26, 2019 with English translation.

* cited by examiner

DISPLAY BACKPLATE AND FABRICATION METHOD THEREOF, DISPLAY PANEL AND DISPLAY DEVICE

The present application claims priority of Chinese Patent Application No. 201810021897.4 filed on Jan. 10, 2018, the disclosure of which is incorporated herein by reference in its entirety as part of the present application.

TECHNICAL FIELD

Embodiments of the present disclosure relate to a display backplate and a fabrication method thereof, a display panel and a display device.

BACKGROUND

In a display field, flat-panel displays have gradually replaced bulky cathode ray tube displays. The flat panel displays include, for example, liquid crystal displays, plasma displays, organic electroluminescent displays, and the like.

SUMMARY

According to embodiments of the disclosure, a display backplate is provided. The display backplate comprises: a substrate; a first light shielding layer, provided on the substrate; a first thin film transistor, provided on a side of the first light shielding layer facing away from the substrate, and including a first active layer, a first source electrode, a first drain electrode and a first top-gate electrode; a first layer, including a first semiconductor portion and a first conductor portion, the first semiconductor portion constituting the first active layer; and a third electrode, the first conductor portion being provided between the first light shielding layer and the third electrode. The first light shielding layer and the first conductor portion form a first capacitance, and the third electrode and the first conductor portion form a second capacitance.

For example, an orthogonal projection of the first active layer on the substrate at least partially overlaps with an orthogonal projection of the first light shielding layer on the substrate, an orthogonal projection of the first conductor portion on the substrate at least partially overlaps with the orthogonal projection of the first light shielding layer on the substrate, and an orthogonal projection of the third electrode on the substrate at least partially overlaps with the orthogonal projection of the first conductor portion on the substrate.

For example, the first conductor portion includes a first portion and a second portion, the first portion of the first conductor portion is electrically connected with the first source electrode, the second portion of the first conductor portion is electrically connected with the first drain electrode; the first active layer is located between the first portion of the first conductor portion and the second portion of the first conductor portion to space them apart from each other; and an orthogonal projection of the first portion of the first conductor portion on the substrate at least partially overlaps with the orthogonal projection of the first light shielding layer on the substrate, and at least partially overlaps with the orthogonal projection of the third electrode on the substrate.

For example, the display backplate further comprises: a second thin film transistor, provided on the substrate, and including a second active layer, a second source electrode, a second drain electrode and a second top-gate electrode; and a second layer, including a second semiconductor portion and a second conductor portion, and the second semiconductor portion constituting the second active layer. The third electrode constitutes the second source electrode.

For example, the second conductor portion includes a first portion and a second portion, the first portion of the second conductor portion is electrically connected with the second source electrode, the second portion of the second conductor portion is electrically connected with the second drain electrode, and the second active layer is located between the first portion of the second conductor portion and the second portion of the second conductor portion to space them apart from each other.

For example, the first layer and the second layer are provided in a same layer; the first source electrode, the first drain electrode, the second source electrode and the second drain electrode are provided in a same layer; and the first top-gate electrode and the second top-gate electrode are provided in a same layer.

For example, an orthogonal projection of the first light shielding layer on the substrate, an orthogonal projection of the first active layer on the substrate, and an orthogonal projection of the first top-gate electrode on the substrate at least partially overlap with one another, and the first light shielding layer is electrically connected with the first top-gate electrode so that the first light shielding layer further serves as a bottom-gate electrode of the first thin film transistor.

For example, the first light shielding layer is electrically connected with the first top-gate electrode through the third electrode.

For example, an orthogonal projection of the first drain electrode on the substrate does not overlap with an orthogonal projection of the first light shielding layer on the substrate.

For example, the display backplate further comprises: a second light shielding layer. The second light shielding layer is provided between the second active layer and the substrate, and an orthogonal projection of the second light shielding layer on the substrate at least partially overlaps with an orthogonal projection of the second active layer on the substrate; and the second light shielding layer and the first light shielding layer are provided in a same layer and electrically insulated from each other.

According to the embodiments of the disclosure, a fabrication method of a display backplate is provided. The method comprises: forming a first light shielding layer on a substrate; forming a first thin film transistor on a side of the first light shielding layer facing away from the substrate, the thin film transistor including a first active layer, a first source electrode, a first drain electrode and a first top-gate electrode; forming a first layer, the first layer including a first semiconductor portion and a first conductor portion, wherein, the first semiconductor portion constitutes the first active layer; forming a third electrode, the first conductor portion being provided between the first light shielding layer and the third electrode. The first light shielding layer and the first conductor portion form a first capacitance, and the third electrode and the first conductor portion form a second capacitance.

For example, the forming a first layer includes: forming a first semiconductor layer on the side of the first light shielding layer facing away from the substrate, and performing a conductor treatment on a portion of the first semiconductor layer to obtain the first semiconductor portion and the first conductor portion; and an orthogonal projection of the first active layer on the substrate at least partially overlaps with an orthogonal projection of the first light shielding layer on the substrate, an orthogonal projection of the first conductor portion on the substrate at least partially overlaps with the orthogonal projection of the first light shielding layer on the substrate, and an orthogonal projection of the third electrode on the substrate at least partially overlaps with the orthogonal projection of the first conductor portion on the substrate.

For example, the method further comprises: forming a second thin film transistor on the substrate, the second thin film transistor including a second active layer, a second source electrode, a second drain electrode and a second top-gate electrode; forming a second layer, the second layer including a second semiconductor portion and a second conductor portion, and the second semiconductor portion constituting the second active layer. The third electrode constitutes the second source electrode.

For example, an orthogonal projection of the first light shielding layer on the substrate, an orthogonal projection of the first active layer on the substrate, and an orthogonal projection of the first top-gate electrode on the substrate at least partially overlap with one another, and the first light shielding layer is electrically connected with the first top-gate electrode so that the first top-gate electrode further serves as a bottom-gate electrode of the first thin film transistor.

For example, the method further comprises: forming a first via hole between the third electrode and the first light shielding layer, for electrically connecting the third electrode with the first light shielding layer; and forming a second via hole between the third electrode and the first top-gate electrode, for electrically connecting the third electrode with the first top-gate electrode.

For example, an orthogonal projection of the first drain electrode on the substrate does not overlap with an orthogonal projection of the first light shielding layer on the substrate.

According to the embodiments of the disclosure, a display panel is provided. The display panel comprises the display backplate as described above.

According to the embodiments of the disclosure, a display device is provided. The display device comprises the display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
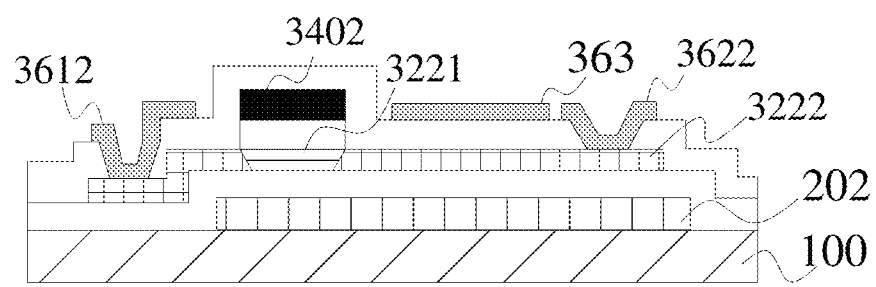
FIG. 1 is a cross-sectional schematic view of a display backplate according to embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "connect" or "interconnect" and the like are not limited to physical or mechanical connections, but may include electrical connections, whether direct or indirect. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed.

With respect to a thin film transistor (TFT) of a top gate type, in order to prevent light from being incident from a side of an active layer facing a base substrate onto the active layer, it is necessary to provide a metal layer between the base substrate and the active layer as a light shielding layer. Further, in order not to leave the metal layer in a floating state, the metal layer and a source electrode of the TFT for example are connected with each other. Although such a connection solution may satisfy requirements of bottom emission display for a normal I-V characteristic of the TFT and a negative bias temperature illumination stress (NBTIS) characteristic, it does not have an effect of increasing an on-state current as compared with a switch TFT.

For example, a laminated capacitor structure of the active layer (for example, whose potential is Vs)/an interlayer insulating layer/a source-drain electrode layer (for example, whose potential is Vg)/a passivation layer/a pixel electrode (for example, whose potential is Vs) may be designed, to increase a pixel capacitance value and improve a driving performance. However, such laminated capacitor structure reduces a light-emitting area and thus sacrifices an aperture ratio.

For example, a packaging process exposes a display panel to an ultraviolet (UV) environment, and processes such as a reliability test process adversely affects characteristics of the TFT, especially light stability of the TFT, so that the packaging process and the processes such as the reliability test process cause poor uniformity of the TFT. If the light shielding layer is added and the design of connecting the light shielding layer with the source electrode of the TFT is used, it is further necessary to ensure requirements on the aperture ratio and a high PPI; however, in this case, an area of a capacitor region is inevitably compressed according to a design rule, and thus, it is impossible to implement the above-described existing laminated capacitor design, and influence of a parasitic capacitance is increased.

Figure 2:
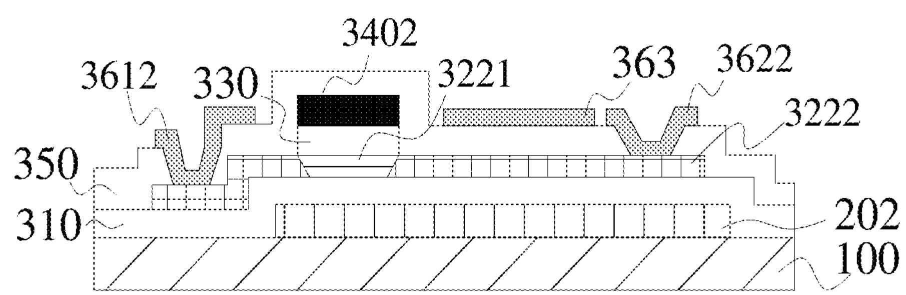
FIG. 2 is another cross-sectional schematic view of the display backplate according to the embodiments of the present disclosure.

According to embodiments of the present disclosure, a display backplate is provided. With reference to FIG. 1 to FIG. 5 and FIG. 8 to FIG. 19, the display backplate according to the embodiments of the present disclosure will be described in detail. It should be noted that, structural schematic views of the display backplate shown in FIG. 1 to FIG. 2 are cross-sectional structural schematic views taken from a drain electrode (D) to a source electrode (S) of a drive TFT, and in top structural schematic views of the display backplate shown in FIG. 3, FIG. 8, FIG. 11, FIG. 13, FIG. 16 and FIG. 18, a substrate and respective insulating layers (including a buffer layer, a gate insulating layer, an interlayer insulating layer, a passivation layer and a planarization layer) are omitted for the purpose of clarity of illustration.

According to the embodiments of the present disclosure, with reference to FIG. 1 to FIG. 5, the display backplate comprises: a substrate 100, a first light shielding layer 202, a first thin film transistor B, a first layer 322 and a third electrode 363; the first light shielding layer 202 is provided on the substrate 100; the first thin film transistor B is provided on a side of the first light shielding layer 202 facing away from the substrate 100, and includes a first active layer 3221, a first source electrode 3622 and a first drain electrode 3612; the first layer 322 includes a first semiconductor portion and a first conductor portion 3222, and the first semiconductor portion constitutes the first active layer 3221 (for example, the first active layer 3221 is consisted of the first semiconductor portion); the third electrode 363 is provided in a same layer as the first source electrode 3622 and the first drain electrode 3612; the first light shielding layer 202 and the first conductor portion 3222 form a first capacitance, and the third electrode 363 and the first conductor portion 3222 form a second capacitance. For example, the first thin film transistor B further comprises a first top-gate electrode 3402.

In order to prevent light from being incident from a side of the first active layer 3221 facing the substrate onto the active layer 3221 to affect stability of the first thin film transistor B, the first light shielding layer 202 is provided between the substrate 100 and the first thin film transistor B. For example, an orthogonal projection of the first active layer 3221 on the substrate 100 at least partially overlaps with an orthogonal projection of the first light shielding layer 202 on the substrate 100. For example, the orthogonal projection of the first active layer 3221 on the substrate 100 is completely within the orthogonal projection of the first light shielding layer 202 on the substrate 100.

The first light shielding layer 202 and the first conductor portion 3222 form the first capacitance, and the third electrode 363 and the first conductor portion 3222 form the second capacitance, so as to obtain a laminated capacitor structure, which implements a high aperture ratio and a high PPI while increasing a pixel capacitance value and improving a driving performance. In this way, the first light shielding layer 202 is further used as an electrode plate of the laminated capacitor structure, which replaces an exclusively-provided electrode in the laminated capacitor structure, and thus makes the display backplate lighter and thinner.

According to the embodiments of the present disclosure, with reference to FIG. 2, the first conductor portion 3222 is provided between the first light shielding layer 202 and the third electrode 363, an orthogonal projection of the first conductor portion 3222 on the substrate 100 at least partially overlaps with the orthogonal projection of the first light shielding layer 202 on the substrate 100, and an orthogonal projection of the third electrode 363 on the substrate 100 at least partially overlaps with the orthogonal projection of the first conductor portion 3222 on the substrate 100. For example, the first conductor portion 3222 includes a first portion and a second portion, the first portion of the first conductor portion 3222 is electrically connected with the first source electrode 3622, the second portion of the first conductor portion 3222 is electrically connected with the first drain electrode 3612; the first active layer 3221 (that is, the first semiconductor portion) is located between the first portion of the first conductor portion 3222 and the second portion of the first conductor portion 3222 to space them apart from each other; and an orthogonal projection of the first portion of the first conductor portion 3222 on the substrate 100 at least partially overlaps with the orthogonal projection of the first light shielding layer 202 on the substrate 100, and further at least partially overlaps with the orthogonal projection of the third electrode 363 on the substrate 100. In this way, the first light shielding layer 202, the first conductor portion 3222 and the third electrode 363 form the laminated capacitor structure by overlapping with each other, and the first conductor portion 3222 is at a Vs potential. The laminated capacitor structure increases the pixel capacitance value and improves the driving performance, without sacrificing the aperture ratio and the high PPI, and thus the influence of the parasitic capacitance is not increased.

It should be noted that, in addition to the first active layer 3221, the first conductor portion 3222, the first top-gate electrode 3402, the first source electrode 3622 and the first drain electrode 3612, the display backplate for example further includes other structures, for example, a buffer layer, a gate insulating layer, an interlayer insulating layer, and the like, which may be provided by those skilled in the art according to actual needs, and will not be limited in the embodiments of the present disclosure. In some embodiments of the present disclosure, with reference to FIG. 2, the first thin film transistor B further includes a buffer layer 310, a gate insulating layer 330 and an interlayer insulating layer 350. The buffer layer 310 is provided between the first light shielding layer 202 and the first layer 322, the gate insulating layer 330 is provided between the first top-gate electrode 3402 and the first active layer 3221, and the interlayer insulating layer 350 covers the first top-gate electrode 3402, the buffer layer 310 and a portion of the first conductor portion 3222.

Figure 3:
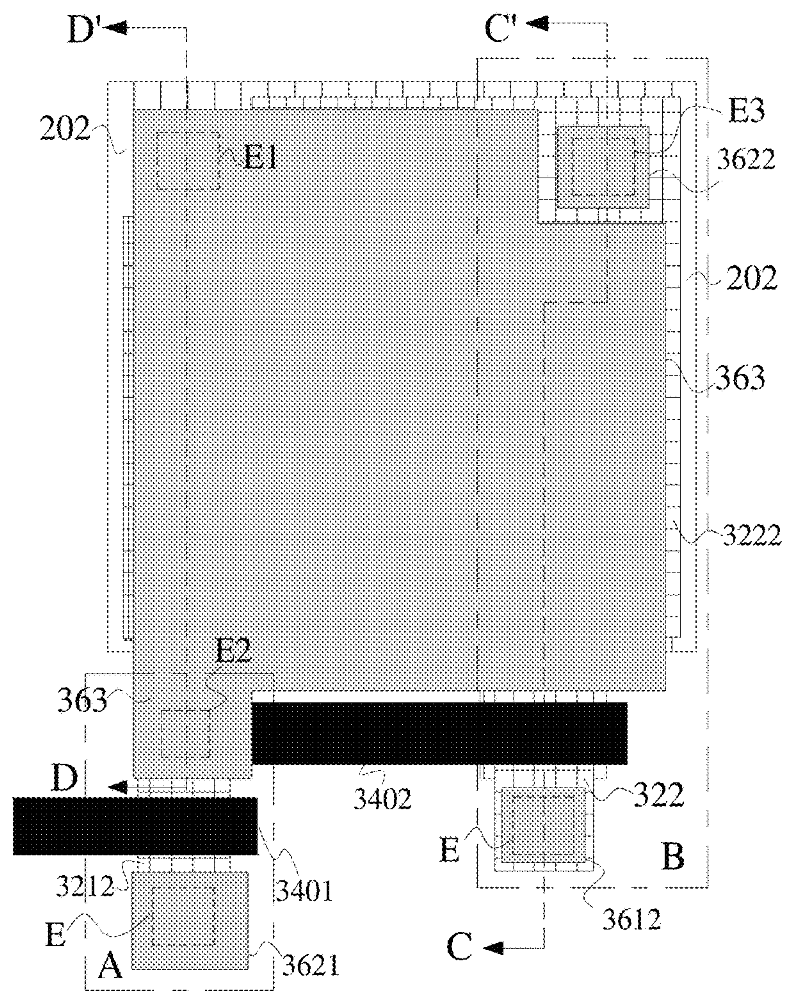
FIG. 3 is a top schematic view of the display backplate according to the embodiments of the present disclosure.

In some embodiments of the present disclosure, with reference to FIG. 3, the display backplate for example further comprises a second thin film transistor A and a second layer 321. For example, the first thin film transistor B serves as a drive TFT, and the second thin film transistor A serves as a switch TFT. For example, the second thin film transistor A is provided on the substrate 100, and includes a second active layer 3211, a second source electrode, a second drain electrode 3621 and a second top-gate electrode 3401; the second layer 321 includes a second semiconductor portion and a second conductor portion 3212, the second semiconductor portion constitutes the second active layer 3211 (for example, the second active layer 3211 is consisted of the second semiconductor portion); the third electrode 363 is the second source electrode of the second thin film transistor A. Thus, not only a dual-TFT structure comprising the first thin film transistor B and the second transistor A is achieved to increase an on-state current, but also the third electrode 363 is further used as the second source electrode of the second thin film transistor A. In FIG. 3, the second active layer 3211 is located directly below the second top-gate electrode 3401, and thus is not shown. For a position of the second active layer 3211, FIG. 11 for example is referred to.

For example, the second conductor portion 3212 includes a first portion and a second portion, the first portion of the second conductor portion 3212 is electrically connected with the second source electrode, the second portion of the second conductor portion 3212 is electrically connected with the second drain electrode 3621, and the second active layer 3211 (that is, the second semiconductor portion) is located between the first portion of the second conductor portion 3212 and the second portion of the second conductor portion 3212 to space them apart from each other.

For example, the first layer 322 and the second layer 321 are provided in a same layer; the first source electrode 3622, the first drain electrode 3612, the second source electrode (i.e., the third electrode 363) and the second drain electrode 3621 are provided in a same layer; and the first top-gate electrode 3402 and the second top-gate electrode 3401 are provided in a same layer. Therefore, the fabrication process of the display backplate is simplified, and a thickness of the display backplate is reduced.

Figure 4:
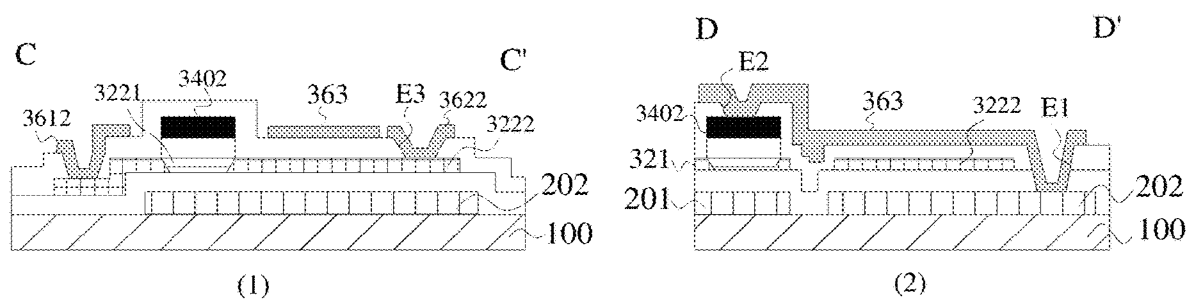
FIG. 4 is a cross-sectional schematic view taken along CC' and DD' in FIG. 3.

For example, the display backplate further comprises a second light shielding layer 201. With reference to FIG. 4, the second light shielding layer 201 and the first light shielding layer 202 for example are provided in a same layer and electrically insulated from each other; in addition, the first light shielding layer 202 is electrically connected with the second source electrode (i.e., the third electrode 363); and thus, the first light shielding layer 202 is prevented from being in a floating state. For example, the display backplate is not provided with the second light shielding layer 201, which renders a higher aperture ratio of the display backplate.

For example, with respect to the display backplate with the dual-TFT structure, with reference to FIG. 4(2), the second light shielding layer 201 is provided between the second active layer 3211 of the second thin film transistor A and the substrate 100, and, an orthogonal projection of the second light shielding layer 201 on the substrate 100 at least partially overlaps with an orthogonal projection of the second active layer 3211 on the substrate 100 (for example, the orthogonal projection of the second active layer 3211 on the substrate 100 is completely within the orthogonal projection of the second light shielding layer 201 on the substrate 100); the first light shielding layer 202 is electrically connected with the first top-gate electrode 3402 of the first thin film transistor B, for making the first light shielding layer 202 constitute a bottom-gate electrode of the first thin film transistor B. In this way, the second light shielding layer 201 only has a light shielding effect on the second thin film transistor A, while the first light shielding layer 202 not only has a light shielding effect on the first thin film transistor B, but also is further used as the bottom-gate electrode of the first thin film transistor B.

According to the embodiments of the present disclosure, the orthogonal projection of the first light shielding layer 202 on the substrate 100, the orthogonal projection of the first active layer 3221 on the substrate 100, and an orthogonal projection of the first top-gate electrode 3402 on the substrate 100 at least partially overlap with one another, and the first light shielding layer 202 is electrically connected with the first top-gate electrode 3402 so that the first light shielding layer 202 constitutes the bottom-gate electrode of the first thin film transistor B. In this way, the first light shielding layer 202 is further electrically connected with the first top-gate electrode 3402 and thus further used as the bottom-gate electrode of the first TFT, so as to increase a driving current of the TFT with double-gate structure, and improve a sub-threshold characteristic of the TFT; in addition, the floating state problem of the first light shielding layer 202 does not exist any more because the first light shielding layer 202 is at a Vg potential.

According to the embodiments of the present disclosure, the first light shielding layer 202 for example is electrically connected with the first top-gate electrode 3402 through the third electrode 363, so that the first light shielding layer 202 and the third electrode 363 are both at the Vg potential, and that the first light shielding layer 202 and the third electrode 363 of the laminated capacitor structure are both at the Vg potential, while the first conductor portion 3222 of the laminated capacitor structure is at the Vs potential, which further makes full use of the laminated capacitor structure's function of increasing a charge storage amount of the pixel capacitor.

Figure 16:
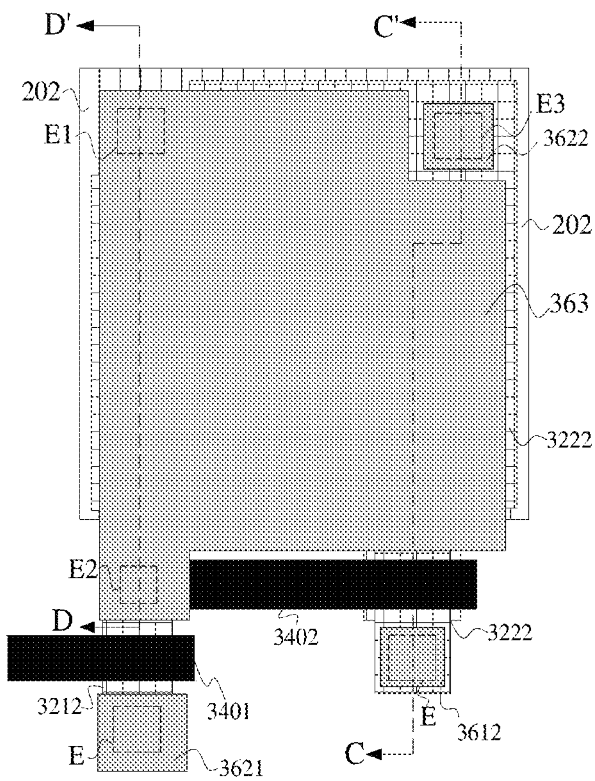
FIG. 16 is a top schematic view after step S240 of the fabrication method of the display backplate according to the embodiments of the present disclosure is completed.

According to the embodiments of the present disclosure, a shape of the third electrode 363 is not particularly limited, as long as it is ensured that an overlapping area between the third electrode 363 and the first conductor portion 3222 satisfies a design requirement of the laminated capacitor structure, and those skilled in the art may design the shape of the third electrode 363 according to the actual requirements of the capacitor structure. For example, the shape of the third electrode 363 is designed as shown in FIG. 16, and the third electrode 363 covers most of the first conductor portion 3222 as well as a first via hole E1 and a second via hole E2. In this way, space occupied by the thin film transistor is fully utilized.

Figure 13:
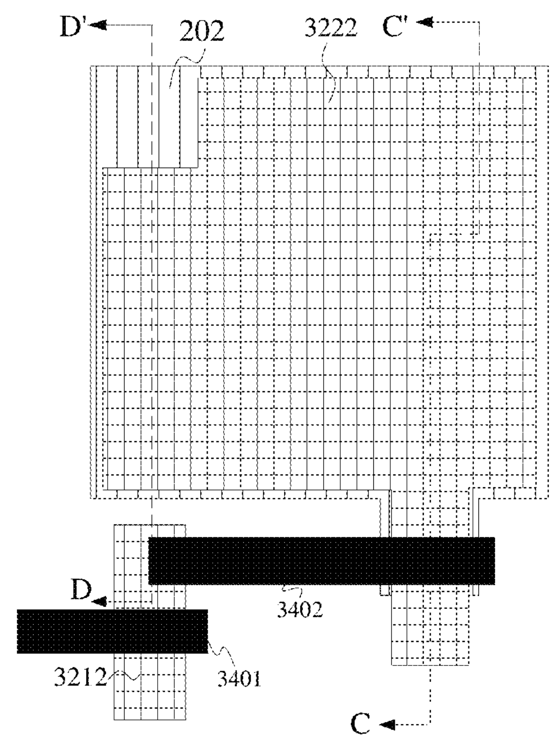
FIG. 13 is a top schematic view after step S210 of the fabrication method of the display backplate according to the embodiments of the present disclosure is completed.

According to the embodiments of the present disclosure, a shape of the first conductor portion 3222 is not particularly limited, as long as it is ensured that an overlapping area between the first conductor portion 3222 and the first light shielding layer 202 satisfies the design requirement of the laminated capacitor structure, and those skilled in the art may design the shape of the first conductor portion 3222 according to the actual requirements of the capacitor structure. For example, the shape of the first conductor portion 3222 is designed as shown in FIG. 13, and the first conductor portion 3222 covers most of the first light shielding layer 202 as well as a via hole E3 for connecting the first source electrode 3622 and the first conductor portion 3222. In this way, the space occupied by the thin film transistor is fully utilized.

Figure 8:
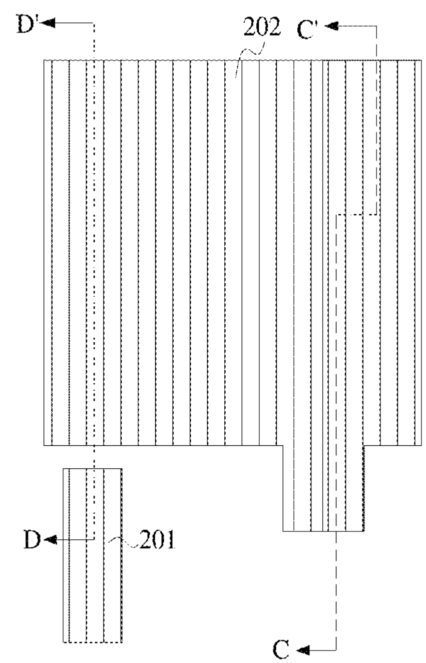
FIG. 8 is a top schematic view after step S100 of the fabrication method of the display backplate according to the embodiments of the present disclosure is completed.

According to the embodiments of the present disclosure, a shape of the first light shielding layer 202 is not particularly limited, as long as it is ensured that the overlapping area between the first light shielding layer 202 and the first conductor portion 3222 satisfies the design requirement of the laminated capacitor structure, and those skilled in the art may design according to the actual requirements of the capacitor structure. For example, the orthogonal projection of the first light shielding layer 202 on the substrate 100 does not overlap with an orthogonal projection of the first drain electrode 3612 on the substrate 100, and thus, a parasitic capacitance $C_{GD}$ is reduced. For example, the shape of the first light shielding layer 202 is designed as shown in FIG. 8, and thus, the space occupied by the thin film transistor is fully utilized. Meanwhile, the orthogonal projection of the first light shielding layer 202 of the above-described shape on the substrate 100, with reference to FIG. 16, does not have any overlapping region with the orthogonal projection of the first drain electrode 3612 on the substrate 100, so that the parasitic capacitance $C_{GD}$ is reduced.

Figure 5:
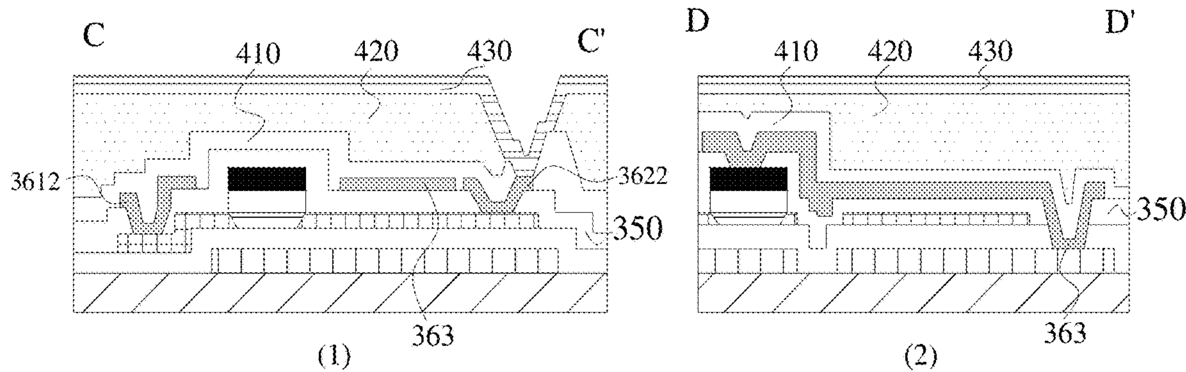
FIG. 5 is another cross-sectional schematic view of the display backplate according to the embodiments of the present disclosure taken along CC' and DD' in FIG. 3.

According to the embodiments of the present disclosure, with reference to FIG. 5, the display backplate for example further comprises a passivation layer 410, a planarization layer 420 and a pixel electrode 430. The passivation layer 410 covers the thin film transistor structure, the planarization layer 420 covers the passivation layer 410, the pixel electrode 430 covers the planarization layer 420, and the pixel electrode 430 is electrically connected with the first source electrode 3622 through a via hole.

According to the embodiments of the present disclosure, a material of the light shielding layer (including the first light shielding layer 202 and the second light shielding layer 201) is not particularly limited, as long as the light shielding layer formed of the material simultaneously has a light shielding effect and a conductivity, and those skilled in the art may select according to actual needs. For example, the material of the light shielding layer is selected from metal materials such as Ag, Cu, Al, Mo, multilayer metals such as Mo/Cu/Mo, metal alloy materials such as AlNd and MoNb, or a stack structure of transparent conductive oxide and metal such as ITO/Ag/ITO. Thus, the light shielding layer formed of the material and having the structure as described above not only has the light shielding effect on the TFT, but also is used as the electrode plate of the laminated capacitor structure.

According to the embodiments of the present disclosure, materials of respective electrodes (including the top-gate electrode, the drain electrode, the source electrode, the third electrode 363, and the pixel electrode 430) are not particularly limited. For example, metal materials such as Ag, Cu, Al, Mo, multilayer metals such as Mo/Cu/Mo, metal alloy materials such as AlNd and MoNb, the stack structure of transparent conductive oxide and metal such as ITO/Ag/ITO, and the like, may be selected by those skilled in the art according to needs, and will not be repeated here.

According to the embodiments of the present disclosure, materials of the first layer 322 and the second layer 321 (each including the active layer and the conductor portion) are not particularly limited, as long as the materials are appliable to the display backplate fabricated by using an oxide technology, a silicon technology and an organic technology, which may be selected by those skilled in the art according to needs. In some embodiments of the present disclosure, with respect to the display backplate of top emission mode, materials of the first layer 322 and the second layer 321 for example are selected from an oxide, a silicon material, and an organic material. For example, the oxide is a-IGZO, ZnON or IZTO, the silicon material is a-Si or p-Si, and the organic material is hexathiophene or polythiophene.

According to the embodiments of the present disclosure, materials of respective insulating layers (including the buffer layer 310, the gate insulating layer 330, the interlayer insulating layer 350 and the passivation layer 410) are not particularly limited, and the materials are, for example, SiOx, SiNx, SiON, an organic insulating material, AlOx, HfOx, TaOx, and other high k materials, which may be selected by those skilled in the art according to needs, and will not be repeated here. According to the embodiments of the present disclosure, a material of the planarization layer 420 is not particularly limited, and the material includes, but not limited to, a planarization material such as a polysiloxane-based material, an acrylic-based material, a polyimide-based material, a color filter material, a material of a pixel defining layer, and the like, which may be selected by those skilled in the art according to needs, and will not be repeated here.

According to the embodiments of the present disclosure, the display backplate is provided. In the display backplate, the light shielding layer not only protects light stability of the TFT structure from being affected, but also constitutes the laminated capacitor structure with the first conductor portion and the third electrode, which implements the high aperture ratio and the high PPI while increasing the pixel capacitance value and improving the driving performance; as such, the first light shielding layer is further used as the electrode plate of the laminated capacitor structure, replaces the exclusively-provided electrode plate in the laminated capacitor structure, and thus the display backplate becomes lighter and thinner.

Figure 6:
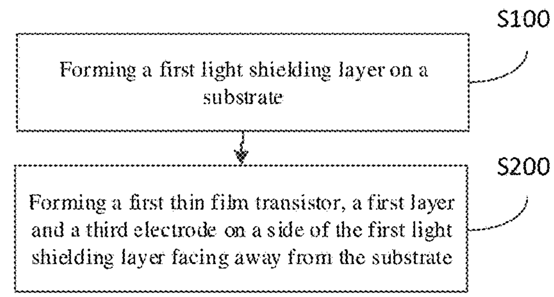
FIG. 6 is a schematic flow chart of a fabrication method of a display backplate according to the embodiments of the present disclosure.
Figure 7:
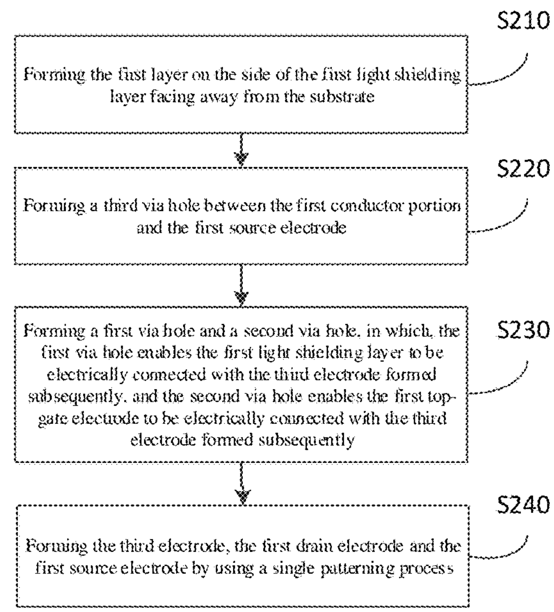
FIG. 7 is a schematic flow chart of step S200 in the fabrication method of the display backplate according to the embodiments of the present disclosure.

According to the embodiments of the present disclosure, a method for fabricating a display backplate is provided. With reference to FIG. 6 to FIG. 19, the fabrication method according to the embodiments of the present disclosure will be described in detail. According to the embodiments of the present disclosure, with reference to FIG. 6, the fabrication method comprises:

S100: forming a first light shielding layer on a substrate.

In the step, the first light shielding layer 202 is formed on the substrate 100, so that the first light shielding layer 202 plays a role in light shielding protection for the thin film transistor structure fabricated in subsequent steps.

According to the embodiments of the present disclosure, the method for forming the first light shielding layer 202 is not particularly limited, and those skilled in the art may select according to a material and a pattern shape of the first light shielding layer. For example, a normal material of an electrode plate of a capacitor is selected as the material of the first light shielding layer; after cleaning of the substrate 100, a light shielding film is deposited on a side of the substrate 100, and the light shielding film is patterned by a patterning process to obtain the first light shielding layer 202. The first light shielding layer 202 fabricated as described above for example is used as an alignment mark, as well as has a light shielding effect, and is further used as the electrode plate of the laminated capacitor structure.

For example, the display backplate has a dual-gate TFT structure, so that the first light shielding layer 202 not only has the light shielding effect on the first thin film transistor B formed in subsequent steps, but also is further used as a bottom-gate electrode of the first thin film transistor B and the electrode plate of the laminated capacitor structure.

Figure 9:
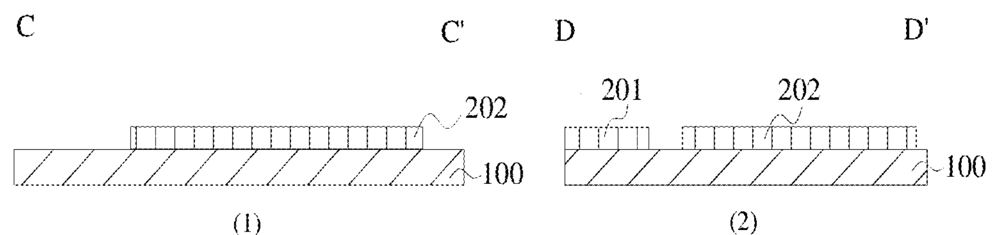
FIG. 9 is a cross-sectional schematic view taken along CC' and DD' in FIG. 8.
Figure 10:
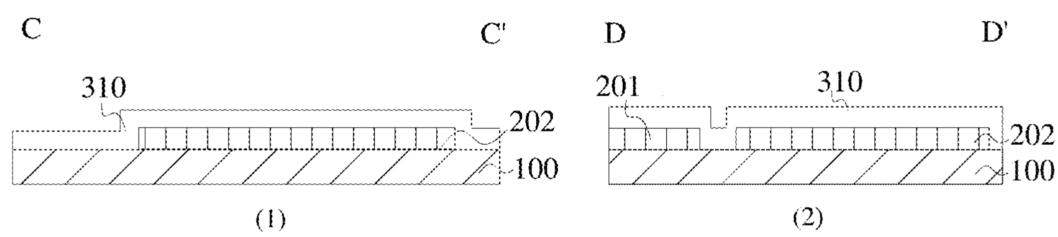
FIG. 10 is a cross-sectional schematic view during step S210 of the fabrication method of the display backplate according to the embodiments of the present disclosure.

For example, the display backplate comprises a dual-TFT structure, and the light shielding layer that has been formed is shown in FIG. 8 to FIG. 9; as shown in FIG. 8 to FIG. 9, the light shielding layer may include a first light shielding layer 202 and a second light shielding layer 201, and the second light shielding layer 201 merely has the light shielding effect on a second thin film transistor A formed in subsequent steps, while the first light shielding layer 202 not only has the light shielding effect on the first thin film transistor B formed in subsequent steps, but also is further used as the bottom-gate electrode of the first thin film transistor B and the electrode plate of the laminated capacitor structure.

S200: forming a first thin film transistor, a first layer and a third electrode on a side of the first light shielding layer facing away from the substrate.

For example, the first thin film transistor B is formed on the side of the first light shielding layer 202 facing away from the substrate 100, and the first thin film transistor B includes a first active layer 3221, a first drain electrode 3612, a first source electrode 3622 and a first top-gate electrode 3402.

According to the embodiments of the present disclosure, the step of forming the first thin film transistor B is not particularly limited, and those skilled in the art may select according to a structure of the first thin film transistor B. For example, with reference to FIG. 7, step S200 for example further includes:

S210: forming the first layer on the side of the first light shielding layer facing away from the substrate.

For example, the first layer 322 is formed on the side of the first light shielding layer 202 facing away from the substrate, the first layer 322 is located between the first light shielding layer 202 and the third electrode 363 to be formed subsequently, and the first layer 322 includes a first semiconductor portion and a first conductor portion 3222; the first semiconductor portion constitutes the first active layer 3221, and an orthogonal projection of the first conductor portion 3222 on the substrate 100 at least partially overlaps with an orthogonal projection of the first light shielding layer 202 on the substrate 100. For example, a first semiconductor layer 3223 is firstly formed between the first light shielding layer 202 and the third electrode 363, and then a portion of the first semiconductor layer 3223 is subjected to a conductor treatment so as to obtain the first active layer 3221 and the first conductor portion 3222.

For example, before the step S210, a buffer layer 310 is firstly formed on the side of the first light shielding layer 202 facing away from the substrate 100, and then the first layer 322 is formed. For example, with reference to FIG. 10, the formed buffer layer 310 covers the first light shielding layer 202, the second light shielding layer 201 and the substrate 100, so that the buffer layer 310 serves as a capacitor dielectric layer between the first light shielding layer 202 and the first conductor portion 3222, and the first light shielding layer 202 is electrically isolated from the first active layer 3221.

According to the embodiments of the present disclosure, the method for forming the first layer 322 is not limited, and those skilled in the art may select according to a specific type of the first thin film transistor B.

For example, the step S210 further includes: firstly forming the first semiconductor layer 3223, then sequentially depositing a gate insulating layer and a top-gate electrode film, patterning the top-gate electrode film to obtain the first top-gate electrode 3402, and performing the conductor treatment on the first semiconductor layer 3223 with the first top-gate electrode 3402 as a mask, to form the first active layer 3221 and the first conductor portion 3222. In this way, the first layer 322 of the first TFT of the top-gate structure is obtained with a more simplified fabrication step.

Figure 11:
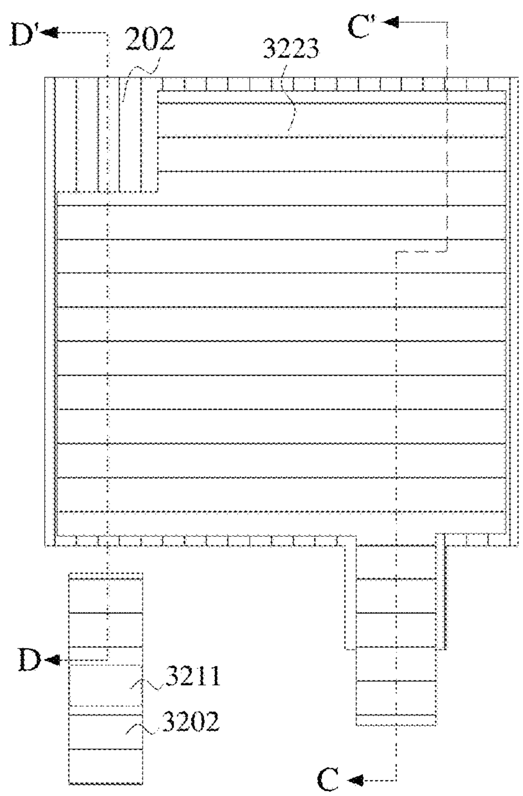
FIG. 11 is a top schematic view during step S210 of the fabrication method of the display backplate according to the embodiments of the present disclosure.
Figure 12:
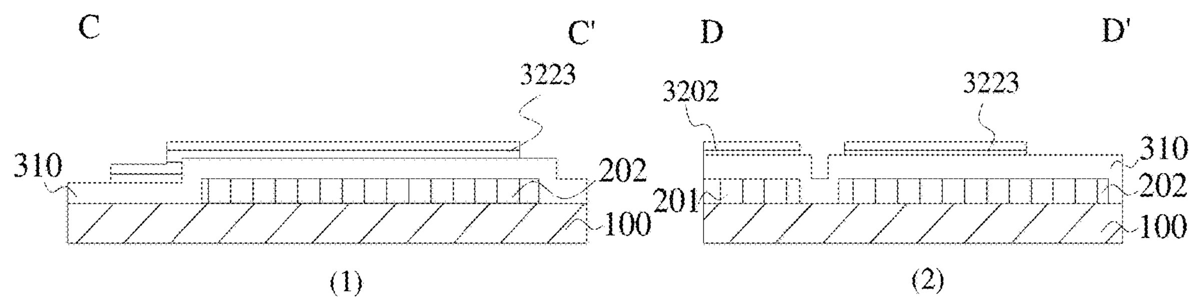
FIG. 12 is a cross-sectional schematic view taken along CC' and DD' in FIG. 11.
Figure 14:
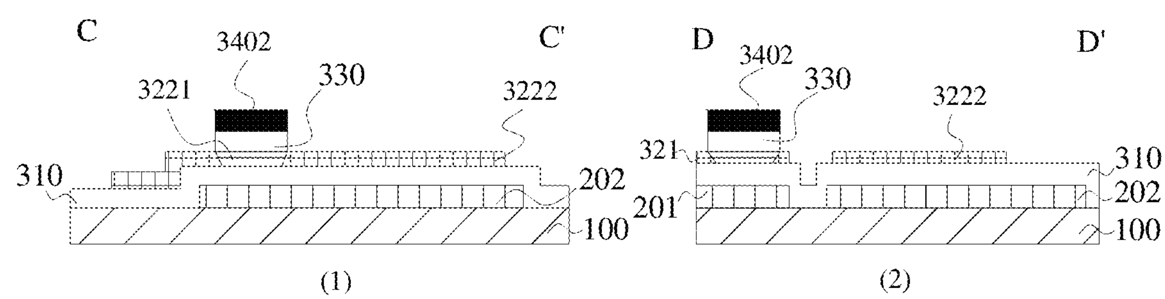
FIG. 14 is a cross-sectional schematic view taken along CC' and DD' in FIG. 13.
Figure 15:
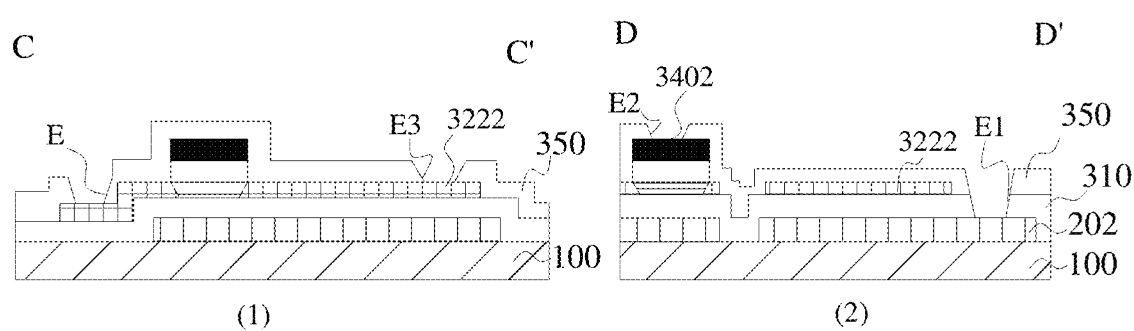
FIG. 15 is a cross-sectional schematic view after steps S220 and S230 of the fabrication method of the display backplate according to the embodiments of the present disclosure are completed.

For example, with respect to the display backplate comprising the dual-TFT structure, a second semiconductor layer 3202 and the first semiconductor layer 3223 are firstly formed by using a single patterning process, and the structure obtained in the step for example is shown in FIG. 11 to FIG. 12; then the gate insulating layer and the top-gate electrode film are sequentially deposited, and the top-gate electrode film is patterned by a patterning process to form a second top-gate electrode 3401 and the first top-gate electrode 3402; finally, the conductor treatment is performed on the first semiconductor layer 3223 with the first top-gate electrode 3402 as a mask so as to form the first active layer 3221 and the first conductor portion 3222, the conductor treatment is performed on the second semiconductor layer 3202 with the second top-gate electrode 3401 as a mask so as to form a second active layer 3211 and a second conductor portion 3212, and a structure obtained in the step for example is shown in FIG. 14 to FIG. 15.

For example, after the step S210, the interlayer insulating layer 350 for example is formed on a side of the first top-gate electrode 3402, the first conductor portion 3222 and the buffer layer 310 facing away from the substrate 100. In this way, the interlayer insulating layer 350 serves as a capacitor dielectric layer between the first conductor portion 3222 and the third electrode 363 formed subsequently.

S220: forming a third via hole between the first conductor portion and the first source electrode.

In the step, the third via hole E3 is formed between the first conductor portion 3222 and the first source electrode 3622 formed in a subsequent step. For example, the third via hole E3 is formed on a side of the interlayer insulating layer 350 facing away from the first conductor portion 3222, and thus, the third via hole E3 enables the first conductor portion 3222 to be electrically connected with the first source electrode 3622 formed in a subsequent step. A position of the third via hole E3 for example is shown in FIG. 15 to FIG. 16.

S230: forming a first via hole and a second via hole, in which, the first via hole enables the first light shielding layer to be electrically connected with the third electrode formed subsequently, and the second via hole enables the first top-gate electrode to be electrically connected with the third electrode formed subsequently.

For example, the first via hole E1 is formed between the third electrode 363 formed subsequently and the first light shielding layer 202, and the first via hole E1 is used for enabling the third electrode 363 formed subsequently to be electrically connected with the first light shielding layer 202; the second via hole E2 is formed between the third electrode 363 formed subsequently and the first top-gate electrode 3402, and the second via hole E2 is used for enabling the third electrode 363 formed subsequently to be electrically connected with the first top-gate electrode 3402. In this way, the first light shielding layer 202 is electrically connected with the third electrode 363 through the first via hole E1, and the third electrode 363 is electrically connected with the first top-gate electrode 3402 through the second via hole E2, so that the third electrode 363 is respectively electrically connected with the first light shielding layer 202 and the first top-gate electrode 3402, which allows both the third electrode 363 and the first light shielding layer 202 in the laminated capacitor structure to be at the Vg potential. For example, positions of the first via hole E1 and the second via hole E2 are shown in FIG. 15 to FIG. 16.

S240: forming the third electrode, the first drain electrode and the first source electrode by using a single patterning process.

In the step, the third electrode 363, the first drain electrode 3612 and the first source electrode 3622 are formed by using a single patterning process, and an orthogonal projection of the third electrode 363 on the substrate 100 at least partially overlaps with an orthogonal projection of the first conductor portion 3222 on the substrate 100, in this way, the third electrode 363 and the first conductor portion 3222 form the second capacitance.

According to the embodiments of the present disclosure, the method for forming the third electrode 363, the first drain electrode 3612 and the first source electrode 3622 is not limited, and those skilled in the art may select according to materials of the third electrode 363, the first drain electrode 3612 and the first source electrode 3622. For example, a source-drain electrode film is firstly deposited on the side of the interlayer insulating layer 350 facing away from the substrate 100, and then the third electrode 363, the first drain electrode 3612 and the first source electrode 3622 are formed by using a single patterning process performed on the source-drain electrode film, in this way, steps and operations of the fabrication method is simplified, and the electrode pattern having a pattern size with a high degree of accuracy is obtained.

Figure 17:
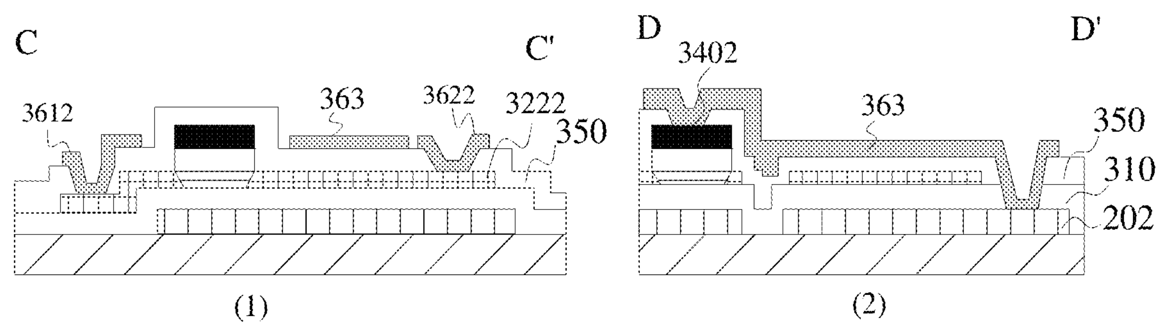
FIG. 17 is a cross-sectional schematic view taken along CC' and DD' in FIG. 16.

For example, with respect to the display backplate of the dual-TFT structure, the third electrode 363, a second drain electrode 3621, the first drain electrode 3612 and the first source electrode 3622 are formed on the side of the interlayer insulating layer 350, the first light shielding layer 202, the first top-gate electrode 3402 and the first conductor portion 3222 facing away from the substrate 100 by using a single patterning process. In this way, not only the dual-TFT structure formed increases an on-state current, but also the third electrode 363 is further used as a first source electrode of the second thin film transistor A. For example, a structure obtained in the step is shown in FIG. 16 to FIG. 17.

For example, an orthogonal projection of the first drain electrode 3612 on the substrate 100 does not overlap with the orthogonal projection of the first light shielding layer 202 on the substrate 100, and thus, the first drain electrode 3612 and the first light shielding layer 202 serving as the bottom-gate electrode do not have any overlapping region, which effectively reduces influence of a parasitic capacitance $C_{GD}$ of the drain electrode.

For example, after the step S200, the fabrication method further comprises:

S300: sequentially forming a passivation layer, a planarization layer and a pixel electrode on a side of the thin film transistor facing away from the substrate.

In the step, the passivation layer 410, the planarization layer 420 and the pixel electrode 430 are sequentially formed on the side of the first thin film transistor B facing away from the substrate 100, and the pixel electrode 430 is electrically connected with the first source electrode 3622.

According to the embodiments of the present disclosure, the method for forming the passivation layer 410, the planarization layer 420 and the pixel electrode 430 is not particularly limited, and those skilled in the art may select according to needs, which will not be repeated here.

Figure 18:
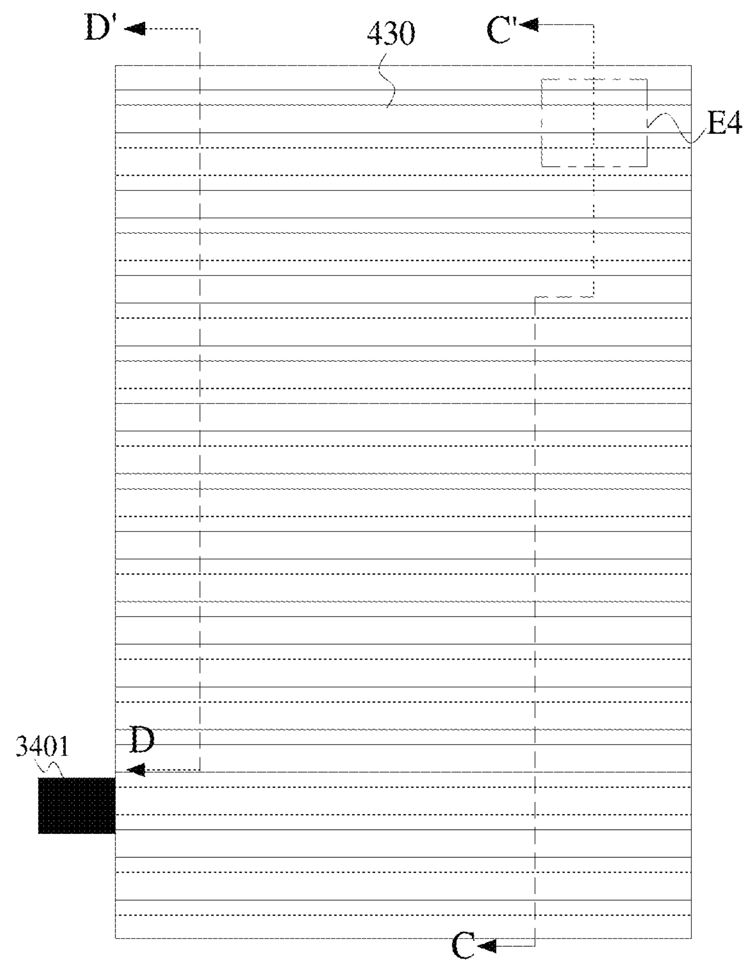
FIG. 18 is a top schematic view after step S300 of the fabrication method of the display backplate according to the embodiments of the present disclosure is completed.
Figure 19:
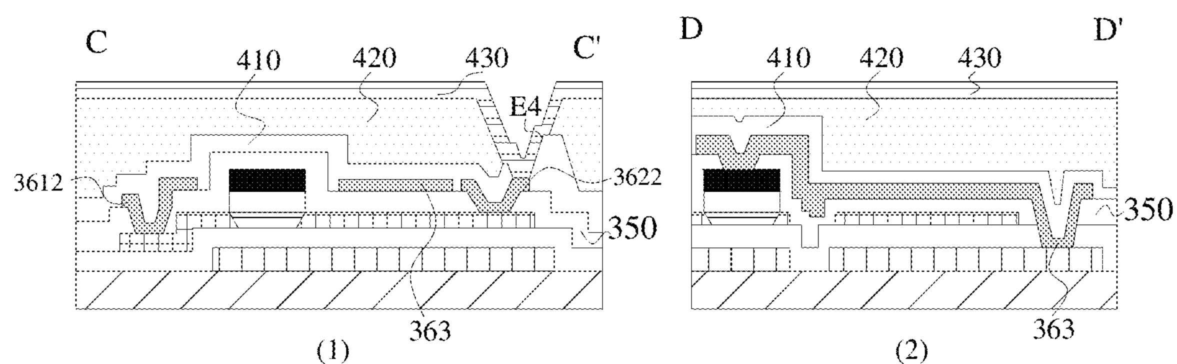
FIG. 19 is a cross-sectional schematic view taken along CC' and DD' in FIG. 18.

For example, with respect to the display backplate of the dual-TFT structure, the passivation layer 410 and the planarization layer 420 are sequentially deposited on the thin film transistor structure obtained in step S200, then a fourth via hole E4 is formed in the passivation layer 410 and the planarization layer 420, and the pixel electrode 430 is formed by deposition. In this way, the pixel electrode 430 is electrically connected with the first source electrode 3622 through the fourth via hole E4. For example, a structure obtained in the step is shown in FIG. 18 to FIG. 19.

According to the embodiments of the present disclosure, the fabrication method is provided. The first light shielding layer is further used as one electrode plate of the laminated capacitor structure, so that the display backplate with a high aperture ratio and a high PPI without decrease in a pixel capacitance value is obtained, and a fabrication cost is not increased by using the fabrication method.

According to the embodiments of the present disclosure, a display panel is provided. According to the embodiment of the present disclosure, the display panel for example comprises the above-described display backplate.

According to the embodiments of the present disclosure, a specific type of the display panel is not particularly limited, for example, it is an OLED display panel, etc., and those skilled in the art may select according to specific use of the display panel, which will not be repeated here. It should also be noted that, the display panel further comprises other necessary parts and components in addition to the display backplate. With the OLED display panel as an example, it further comprises, for example, an OLED element, a glass cover plate or a polarizer, and the like, which may be selected by those skilled in the art according to a specific type and an actual function of the display panel, and will not be repeated here.

According to the embodiments of the present disclosure, a specific emission mode of the display panel is not particularly limited, and those skilled in the art may design according to actual needs. For example, the display panel is of a bottom emission mode; with respect to the laminated capacitor structure of the display backplate, a portion of the light shielding layer is used as the electrode plate of the capacitor to replace an exclusively-provided ITO electrode plate of an existing laminated capacitor structure, which thus, enlarges an area of light-emitting region and improves an aperture ratio, under the premise of ensuring that a pixel capacitance value is constant. For example, the display panel is of a top emission mode; the light shielding layer is provided between the substrate and the thin film transistor, which prevents the TFT from being exposed to ultraviolet (UV) or ambient light, and prevents a threshold voltage (Vth) of the TFT from being affected, avoiding degradation of a panel uniformity and a bias stress characteristic, and meanwhile, the laminated capacitor structure is implemented to ensure the pixel capacitance value to be constant or even to increase.

According to the embodiments of the present disclosure, the display backplate is provided, in which TFT driving current becomes larger, so that the display panel has a better display effect without increasing its thickness. Those skilled in the art may understand that, features and advantages as described above with respect to the display backplate are still applicable to the display panel, which will not be repeated here.

According to the embodiments of the present disclosure, a display device is provided. According to the embodiments of the present disclosure, the display device comprises the above-described display panel.

According to the embodiments of the present disclosure, a specific type of the display device is not particularly limited, for example, it is an OLED display device, etc., and those skilled in the art may design according to a specific use requirement of the display panel, which will not be repeated here. It should also be noted that, the display device further comprises other necessary parts and components in addition to the display panel. For example, with the OLED display device as an example, it further comprises, for example, a housing, a circuit control panel or a power line, etc., which may be selected by those skilled in the art according to a specific type and an actual function of the display panel, and will not be repeated here.

According to the embodiments of the present disclosure, the display device is provided, in which the display panel has the better display effect without increasing its thickness, so that display quality of the display device is better. Those skilled in the art may understand that, features and advantages as described above with respect to the display backplate and the display panel are still applicable to the display device, which will not be repeated here.

The foregoing embodiments merely are exemplary embodiments of the present disclosure, and not intended to define the scope of the present disclosure, and the scope of the present disclosure is determined by the appended claims.

The invention claimed is:

1. A display backplate, comprising:

a substrate;

a first light shielding layer, provided on the substrate;

a first thin film transistor, provided on a side of the first light shielding layer facing away from the substrate, and including a first active layer, a first source electrode, a first drain electrode and a first top-gate electrode;

a first layer, including a first semiconductor portion and a first conductor portion, the first semiconductor portion constituting the first active layer; and a third electrode, the first conductor portion being provided between the first light shielding layer and the third electrode, wherein the first light shielding layer and the first conductor portion form a first capacitance, and the third electrode and the first conductor portion form a second capacitance, wherein the display backplate further comprises: a second thin film transistor, provided on the substrate, and including a second active layer, a second source electrode, a second drain electrode and a second top-gate electrode; and a second layer, including a second semiconductor portion and a second conductor portion, and the second semiconductor portion constituting the second active layer, and wherein the third electrode constitutes the second source electrode.

2. The display backplate according to claim 1, wherein, an orthogonal projection of the first active layer on the substrate at least partially overlaps with an orthogonal projection of the first light shielding layer on the substrate, an orthogonal projection of the first conductor portion on the substrate at least partially overlaps with the orthogonal projection of the first light shielding layer on the substrate, and an orthogonal projection of the third electrode on the substrate at least partially overlaps with the orthogonal projection of the first conductor portion on the substrate.

3. The display backplate according to claim 2, wherein, the first conductor portion includes a first portion and a second portion, the first portion of the first conductor portion is electrically connected with the first source electrode, the second portion of the first conductor portion is electrically connected with the first drain electrode;

the first active layer is located between the first portion of the first conductor portion and the second portion of the first conductor portion to space them apart from each other; and an orthogonal projection of the first portion of the first conductor portion on the substrate at least partially overlaps with the orthogonal projection of the first light shielding layer on the substrate, and at least partially overlaps with the orthogonal projection of the third electrode on the substrate.

4. The display backplate according to claim 1, wherein, the second conductor portion includes a first portion and a second portion, the first portion of the second conductor portion is electrically connected with the second source electrode, the second portion of the second conductor portion is electrically connected with the second drain electrode, and the second active layer is located between the first portion of the second conductor portion and the second portion of the second conductor portion to space them apart from each other.

5. The display backplate according to claim 1, wherein, the first layer and the second layer are provided in a same layer;

the first source electrode, the first drain electrode, the second source electrode and the second drain electrode are provided in a same layer; and the first top-gate electrode and the second top-gate electrode are provided in a same layer.

6. The display backplate according to claim 1, wherein, an orthogonal projection of the first light shielding layer on the substrate, an orthogonal projection of the first active layer on the substrate, and an orthogonal projection of the first top-gate electrode on the substrate at least partially overlap with one another, and the first light shielding layer is electrically connected with the first top-gate electrode so that the first light shielding layer further serves as a bottom-gate electrode of the first thin film transistor.

7. The display backplate according to claim 6, wherein, the first light shielding layer is electrically connected with the first top-gate electrode through the third electrode.

8. The display backplate according to claim 1, wherein, an orthogonal projection of the first drain electrode on the substrate does not overlap with an orthogonal projection of the first light shielding layer on the substrate.

9. The display backplate according to claim 1, further comprising: a second light shielding layer, wherein, the second light shielding layer is provided between the second active layer and the substrate, and an orthogonal projection of the second light shielding layer on the substrate at least partially overlaps with an orthogonal projection of the second active layer on the substrate; and the second light shielding layer and the first light shielding layer are provided in a same layer and electrically insulated from each other.

10. A display panel, comprising the display backplate according to claim 1.

11. A display device, comprising the display panel according to claim 10.

12. A fabrication method of a display backplate, comprising:

forming a first light shielding layer on a substrate;

forming a first thin film transistor on a side of the first light shielding layer facing away from the substrate, the thin film transistor including a first active layer, a first source electrode, a first drain electrode and a first top-gate electrode;

forming a first layer, the first layer including a first semiconductor portion and a first conductor portion, wherein, the first semiconductor portion constitutes the first active layer;

forming a third electrode, the first conductor portion being provided between the first light shielding layer and the third electrode;

wherein the first light shielding layer and the first conductor portion form a first capacitance, and the third electrode and the first conductor portion form a second capacitance;

wherein the method further comprises:

forming a second thin film transistor on the substrate, the second thin film transistor including a second active layer, a second source electrode, a second drain electrode and a second top-gate electrode; and forming a second layer, the second layer including a second semiconductor portion and a second conductor portion, and the second semiconductor portion constituting the second active layer, and wherein the third electrode constitutes the second source electrode.

13. The method according to claim 12, wherein, the forming a first layer includes: forming a first semiconductor layer on the side of the first light shielding layer facing away from the substrate, and performing a conductor treatment on a portion of the first semiconductor layer to obtain the first semiconductor portion and the first conductor portion; and an orthogonal projection of the first active layer on the substrate at least partially overlaps with an orthogonal projection of the first light shielding layer on the substrate, an orthogonal projection of the first conductor portion on the substrate at least partially overlaps with the orthogonal projection of the first light shielding layer on the substrate, and an orthogonal projection of the third electrode on the substrate at least partially overlaps with the orthogonal projection of the first conductor portion on the substrate.

14. The method according to claim 12, wherein, an orthogonal projection of the first light shielding layer on the substrate, an orthogonal projection of the first active layer on the substrate, and an orthogonal projection of the first top-gate electrode on the substrate at least partially overlap with one another, and the first light shielding layer is electrically connected with the first top-gate electrode so that the first top-gate electrode further serves as a bottom-gate electrode of the first thin film transistor.

15. The method according to claim 14, further comprising:

forming a first via hole between the third electrode and the first light shielding layer, for electrically connecting the third electrode with the first light shielding layer; and forming a second via hole between the third electrode and the first top-gate electrode, for electrically connecting the third electrode with the first top-gate electrode.

16. The method according to claim 12, wherein, an orthogonal projection of the first drain electrode on the substrate does not overlap with an orthogonal projection of the first light shielding layer on the substrate.

* * * * *